United States Patent
Peng

(10) Patent No.: US 9,345,159 B2
(45) Date of Patent: May 17, 2016

(54) WATER-PROOF STRUCTURE PROVIDED WITH INTERNAL BAROMETER FOR TERMINAL DEVICE AND METHOD FOR CONTROLLING A WATER-PROOF STRUCTURE

(71) Applicant: Huawei Device Co., LTD, Shenzhen (CN)

(72) Inventor: Xu Peng, Shenzhen (CN)

(73) Assignee: Huawei Device Co., Ltd., Shenzhen (CN)

( * ) Notice: Subject to any disclaimer, the term of this patent is extended or adjusted under 35 U.S.C. 154(b) by 186 days.

(21) Appl. No.: 13/941,229

(22) Filed: Jul. 12, 2013

(65) Prior Publication Data

US 2014/0069514 A1    Mar. 13, 2014

(30) Foreign Application Priority Data

Sep. 13, 2012    (CN) .......................... 2012 1 0338554

(51) Int. Cl.
*F16K 17/36*    (2006.01)
*F16K 24/04*    (2006.01)
(Continued)

(52) U.S. Cl.
CPC ................ *H05K 5/068* (2013.01); *F16K 17/36* (2013.01); *F16K 31/005* (2013.01); *G01L 19/0672* (2013.01); *H04M 1/18* (2013.01); *H04M 1/21* (2013.01); *Y10T 137/2036* (2015.04)

(58) Field of Classification Search
CPC ..... H04M 1/18; H04M 1/21; H04M 2250/12; H04B 2001/3894; H05K 5/068; G01L 19/0672; G06F 1/1656; Y10T 137/1842; Y10T 137/2036; F16K 31/005; F16K 17/36

USPC ............. 137/78.1, 81.1, 81.2, 197, 199, 392, 137/453, 454; 455/575.1, 575.8; 361/679.01, 679.02, 679, 679.3, 361/679.56, 824
See application file for complete search history.

(56) References Cited

U.S. PATENT DOCUMENTS

| | | | | |
|---|---|---|---|---|
| 3,734,123 A | * | 5/1973 | Pomerantz | ............ D06F 39/087 137/392 |
| 2002/0095721 A1 | * | 7/2002 | Quintana | .................. E03D 1/00 4/661 |

(Continued)

FOREIGN PATENT DOCUMENTS

CN    101014056 A    8/2007
CN    201193970 Y    2/2009

(Continued)

OTHER PUBLICATIONS

International Search Report and Written Opinion received in Application No. PCT/CN2013/077643 mailed Oct. 3, 2013, 9 pages.

(Continued)

*Primary Examiner* — Mary McManmon
*Assistant Examiner* — Hailey K Do
(74) *Attorney, Agent, or Firm* — Slater Matsil, LLP

(57) ABSTRACT

A water-proof structure has an internal barometer for a terminal device. The water-proof structure is an internal cavity of the terminal device. The water-proof structure is provided with an opening on a casing of the terminal device. A barometer is arranged inside the water-proof structure. A water drop detection device is arranged between a water-proof mesh net and the barometer. The water drop detection device is electrically connected to a control valve, and when a water volume detected by the water drop detection device reaches a water volume threshold value, the control valve is closed.

17 Claims, 3 Drawing Sheets

(51) Int. Cl.
*F16K 21/18* (2006.01)
*G05D 9/12* (2006.01)
*G05D 9/02* (2006.01)
*H01M 2/36* (2006.01)
*F24C 5/18* (2006.01)
*H05K 5/06* (2006.01)
*G01L 19/06* (2006.01)
*H04M 1/18* (2006.01)
*H04M 1/21* (2006.01)
*F16K 31/00* (2006.01)

(56) References Cited

U.S. PATENT DOCUMENTS

2008/0254330 A1* 10/2008 Jones ............... H01M 12/065
 429/407
2010/0154516 A1 6/2010 Hattori et al.

2011/0279931 A1 11/2011 Nakamura

FOREIGN PATENT DOCUMENTS

| CN | 202068171 U | 12/2011 |
| CN | 202309804 U | 7/2012 |
| DE | 202007001823 U1 | 5/2007 |
| EP | 2487326 A1 | 8/2012 |
| GB | 2432923 A | 6/2007 |
| JP | 2010130255 A | 6/2010 |
| JP | 2010151548 A | 7/2010 |
| JP | 2011114510 A | 6/2011 |
| JP | 2011228416 | 11/2011 |

OTHER PUBLICATIONS

Extended European Search Report received in Application No. 13176690.9-1972 mailed May 9, 2014, 5 pages.

* cited by examiner

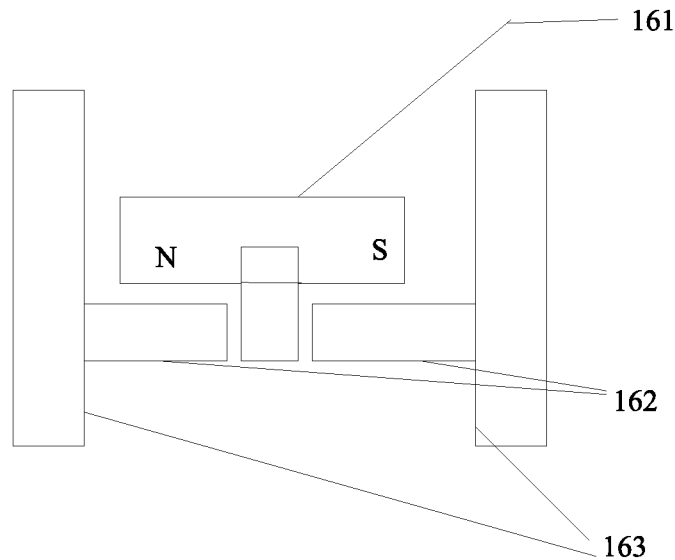
FIG. 3
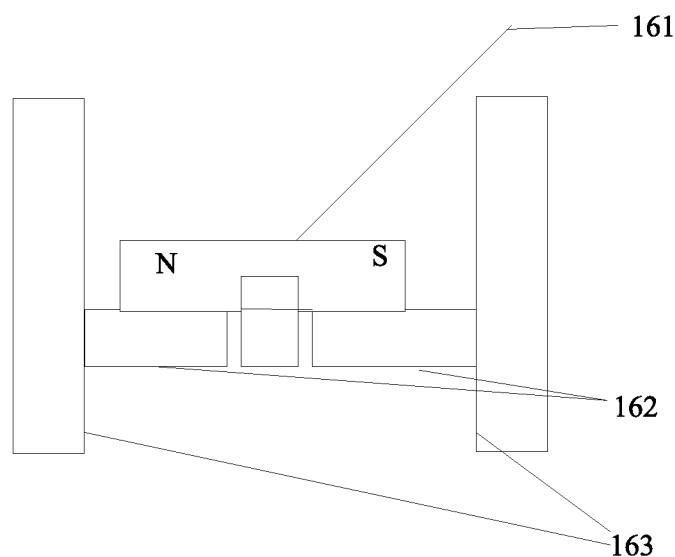
FIG. 3.1

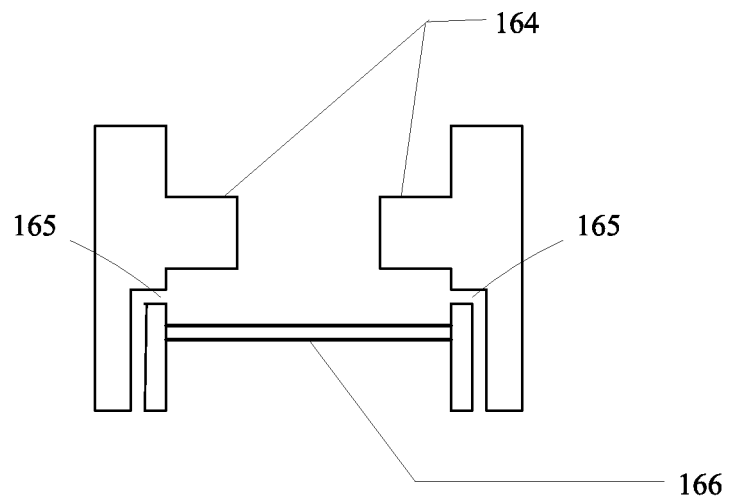
FIG. 4
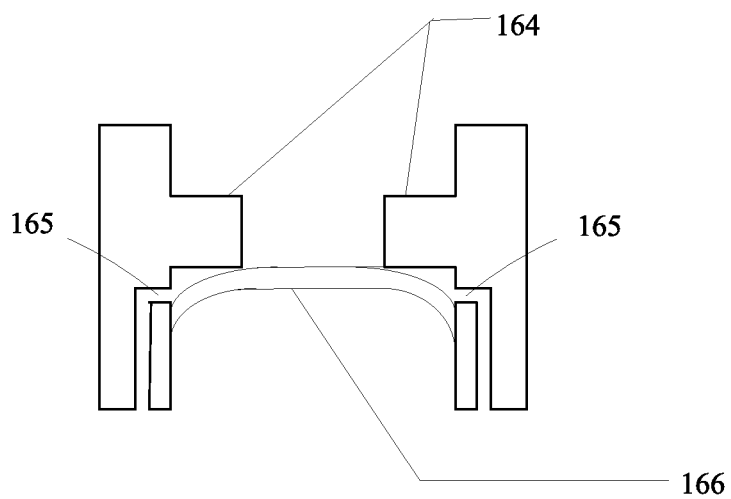
FIG. 4.1

WATER-PROOF STRUCTURE PROVIDED WITH INTERNAL BAROMETER FOR TERMINAL DEVICE AND METHOD FOR CONTROLLING A WATER-PROOF STRUCTURE

This application claims priority to Chinese Patent Application No. 201210338554.3, filed on Sep. 13, 2012, which is hereby incorporated by reference in its entirety.

TECHNICAL FIELD

The present invention relates to the field of terminal devices, and in particular, to a water-proof structure provided with an internal barometer for a terminal device, a terminal device, and a control method.

BACKGROUND

With the development of technologies, the dust-proof and water-proof requirements for a mobile phone terminal become increasingly higher. At present, in the world-wide IP (international protection, international protection) XX water-proof and dust-proof rating, the first X indicates the dust-proof rating. The larger the X is, the higher the dust-proof rating is. The second X indicates the water-proof rating. The larger the X is, the higher the water-proof rating is.

In an existing mobile phone terminal product, a barometer may be arranged to measure the vertical height of the location of the mobile phone terminal. The communication between the barometer and the external environment needs to be kept to guarantee the sensitivity of the barometer.

In the prior art, a mobile phone terminal with an internal barometer may employ an IPX5 water-proof rating, so that besides water-proof property, barometric pressure transmission is guaranteed. In another solution, an IPX7 water-proof rating is employed, which adopts a water-proof film with high water-proof performance. Therefore, when the mobile phone terminal falls into water, the water-proof effect is still satisfactory.

However, during the implementation of the foregoing technical solutions, the inventor finds that the prior art at least has the following drawbacks: The IPX5 water-proof rating fails to meet water-proof requirements when the mobile phone terminal falls into water; and the IPX7 water-proof rating is inconvenient for real-time measurement of the vertical height of the location of the mobile phone terminal because the aperture of the water-proof film is overly small, resulting in poor air permeability and delay in barometric pressure transmission between the inside and the outside of the mobile terminal.

SUMMARY

Embodiments of the present invention provide a water-proof structure provided with an internal barometer for a terminal device, a terminal device, and a control method, which are capable of achieving water-proof property and air permeability of mobile terminals.

The embodiments of the present invention provide the following technical solutions.

In a first aspect, a water-proof structure provided with an internal barometer for a terminal device is provided, where the water-proof structure is an internal cavity of the terminal device, the water-proof structure is provided with an opening on a casing of the terminal device so that a barometric pressure inside the water-proof structure is communicated with an external barometric pressure, a barometer is arranged inside the water-proof structure, a dust-proof net is arranged between the opening and the barometer, and a water-proof mesh net is arranged between the dust-proof net and the barometer;

a water drop detection device is arranged between the water-proof mesh net and the barometer, and a control valve is arranged between the water drop detection device and the barometer; and the water drop detection device is electrically connected to the control valve, and when a water volume detected by the water drop detection device reaches a water volume threshold value, the control valve is closed.

In a first possible implementation manner of the first aspect, the control valve includes two ferromagnetic clapboards and an electromagnet, where the two ferromagnetic clapboards are symmetrically fixed on an inner cavity wall of the internal cavity, and the electromagnet is arranged on the same side as the two ferromagnetic clapboards; and the electromagnet is electrically connected to the water drop detection device, so that when receiving an electric signal from the water drop detection device, the electromagnet is electrified and drawn onto the two ferromagnetic clapboards to achieve sealing.

In a second possible implementation manner of the first aspect, the control valve includes a ring-shaped ferromagnetic clapboard and an electromagnet, where the ring-shaped ferromagnetic clapboard is fixed on an inner cavity wall of the internal cavity, and the electromagnet is arranged on the same side as the ring-shaped ferromagnetic clapboard; and the electromagnet is electrically connected to the water drop detection device, so that when receiving an electric signal from the water drop detection device, the electromagnet is electrified and drawn onto the ring-shaped ferromagnetic clapboard to achieve sealing.

In a third possible implementation manner of the first aspect, the control valve includes two cavity wall protrusions, two air guiding holes, and a piezoelectric ceramic piece, where the two cavity wall protrusions are systematically fixed on an inner cavity wall of the internal cavity; the piezoelectric ceramic piece is arranged between the two cavity wall protrusions and the barometer and divides the internal cavity into two parts; the two air guiding holes are located between the two cavity wall protrusions and the piezoelectric ceramic piece and are systematically arranged on the inner cavity wall of the internal cavity, and the barometer is communicated with the external barometric pressure through the two air guiding holes; and the piezoelectric ceramic piece is electrically connected to the water drop detection device, so that when receiving an electric signal from the water drop detection device, the piezoelectric ceramic piece deforms elastically and contacts the two cavity wall protrusions to achieve sealing.

In a fourth possible implementation manner of the first aspect, the control valve includes a ring-shaped cavity wall protrusion, at least one air guiding hole, and a piezoelectric ceramic piece, where the ring-shaped cavity wall protrusion is fixed on an inner cavity wall of the internal cavity; the piezoelectric ceramic piece is arranged between the ring-shaped cavity wall protrusion and the barometer and divides the internal cavity into two parts; the at least one air guiding hole is located between the ring-shaped cavity wall protrusion and the piezoelectric ceramic piece and is arranged on the inner cavity wall of the internal cavity, and the barometer is communicated with the external barometric pressure through the at least one air guiding hole; and the piezoelectric ceramic piece is electrically connected to the water drop detection device, so that when receiving an electric signal from the water drop detection device, the piezoelectric ceramic piece deforms elastically and contacts the ring-shaped cavity wall protrusion to achieve sealing.

With reference to any one of the first possible implementation manner to the fourth possible implementation manner of the first aspect, in a fifth possible implementation manner, surfaces of the electromagnet and the two ferromagnetic clapboards are coated with a water-proof material, and contact surfaces between the electromagnet and the two ferromagnetic clapboards are covered with a silica gel material; and contact surfaces between the piezoelectric ceramic piece and the two cavity wall protrusions are covered with a silica gel material.

In a second aspect, a terminal device is provided, including any one of the foregoing water-proof structures.

In a third aspect, a method for controlling a water-proof structure is further provided, including:

detecting, by a water drop detection device, whether a voltage value corresponding to a water volume reaching exceeds a voltage value corresponding to a water volume threshold value;

when the voltage value corresponding to the water volume exceeds the voltage value corresponding to the water volume threshold value, sending, by the water drop detection device, an electric signal to a control valve to notify the control valve of executing a close action the water volume; and executing, by the control valve, the close action after receiving the electric signal.

The embodiments of the present invention provide a water-proof structure provided with an internal barometer for a terminal device, a terminal device, and a control method, where, the water-proof mesh net arranged between the dust-proof net and the water drop detection device is capable of achieving the air permeability of the terminal device; the water drop detection device is electrically connected to the control valve and is used to detect a voltage value corresponding to a reached water volume; and when the voltage value corresponding to the water volume exceeds the voltage value corresponding to the water volume threshold value, the control valve is closed, thereby achieving the water-proof property of the terminal device.

BRIEF DESCRIPTION OF DRAWINGS

FIG. 3 is a schematic structural diagram of a control valve according to an embodiment of the present invention;

FIG. 3.1 is a schematic structural diagram of a control valve in a closed state according to an embodiment of the present invention;

FIG. 4 is a schematic structural diagram of another control valve according to an embodiment of the present invention; and FIG. 4.1 is a schematic structural diagram of another control valve in a closed state according to an embodiment of the present invention.

DESCRIPTION OF EMBODIMENTS

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by persons of ordinary skill in the art based on the embodiments of the present invention without creative efforts shall fall within the protection scope of the present invention.

Figure 1:
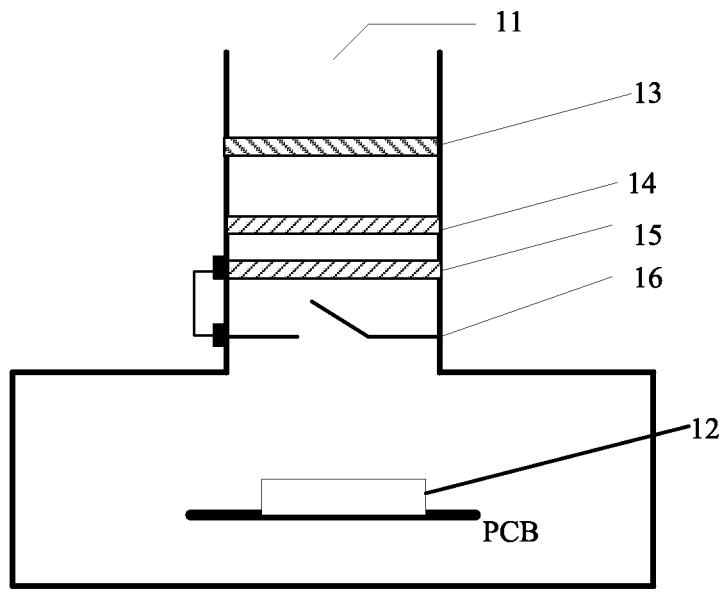
FIG. 1 is a schematic diagram of a water-proof structure according to an embodiment of the present invention.

An embodiment of the present invention provides a water-proof structure provided with an internal barometer for a terminal device, as shown in FIG. 1, including a dust-proof net 13, a water-proof mesh net 14, a water drop detection device 15, a control valve 16, and a barometer 12, where the barometer 12 is arranged on a PCB (printed circuit board, printed circuit board). The water-proof structure is an internal cavity of the terminal device and is provided with an opening 11 on a casing of the terminal device. Through the opening 11, a barometric pressure inside the water-proof structure is communicated with an external barometric pressure to guarantee the sensitivity of the barometer 12.

The water drop detection device 15 is arranged between the water-proof mesh net 14 and the barometer 12, and the control valve 16 is arranged between the water drop detection device 15 and the barometer 12. Besides, the water drop detection device 15 is electrically connected to the control valve 16, so that when a voltage value corresponding to a water volume detected by the water drop detection device 15 reaches a voltage value corresponding to a water volume threshold value, the water drop detection device 15 controls the control valve 16 to execute a close action. The close action may be implemented through electrical control.

In a practical scenario, the dust-proof net 13 may be of an IP5X dust-proof rating. This rating can prevent the water-proof mesh net 14 from being clogged with dust. The water-proof mesh net 14 is of an IPX5 water-proof rating. In the IPXX protection rating, the IPX5 water-proof rating can prevent intrusion of jetted water, and is specifically defined as: preventing water jetted from a nozzle in all directions from entering the terminal device to cause damage. In a normal state, the control valve 16 is in a non-closed state to guarantee the communication between the barometer 12 and the external barometric pressure. However, when the terminal device falls into water, the water-proof mesh net 14 is incapable of providing a water-proof function. In the embodiment of the present invention, the water drop detection device 15 is used to detect the water volume, and the water drop detection device may be a meshed water drop monitoring net. When the voltage value corresponding to the detected water volume reaches a voltage value corresponding to a preset water volume threshold value, the water drop detection device 15 controls the control valve 16 to be closed. In this way, the terminal device has a favorable water-proof property when sinking into water. Specifically, an IPX7 water-proof rating may be reached, and this rating can guarantee that the terminal device is prevented from being damaged when sinking into water one meter deep for a short period of time.

Figure 2:
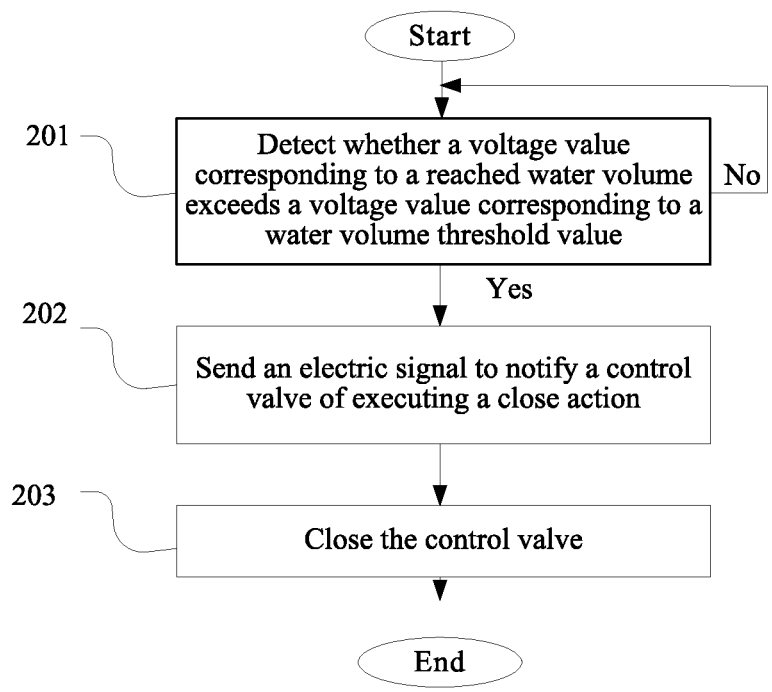
FIG. 2 is a flowchart of closing a control valve according to an embodiment of the present invention.

An embodiment of the present invention further provides a method for controlling a water-proof structure. As shown in FIG. 2, the method includes the following steps:

Step 201: A water drop detection device detects whether a voltage value corresponding to a reached water volume exceeds a voltage value corresponding to a water volume threshold value.

The voltage value corresponding to the water volume threshold value may be a preset voltage value and the voltage value is saved in a storage device attached to the water drop detection device. A water volume reaching the water drop detection device is converted into a corresponding voltage value, and the voltage value is compared with the preset voltage value. If the voltage value exceeds the preset voltage value, perform step 202; otherwise, continue with the water volume detection action.

Step 202: When the voltage value corresponding to the water volume exceeds the voltage value corresponding to the water volume threshold value, the water drop detection device sends an electric signal to a control valve to notify the control valve of executing a close action.

Step 203: After receiving the electric signal, the control valve executes the close action to achieve water-proof sealing.

The embodiments of the present invention provide a waterproof structure provided with an internal barometer for a terminal device and a corresponding control method, where, the water-proof mesh net arranged between the dust-proof net and the water drop detection device is capable of achieving the air permeability of the terminal device; the water drop detection device is electrically connected to the control valve and is used to detect a voltage value corresponding to a reached water volume; and when the voltage value corresponding to the water volume exceeds the voltage value corresponding to the water volume threshold value, the control valve is closed, thereby achieving the water-proof property of the terminal device. Therefore, when the water-proof mesh net is capable of meeting water-proof requirements, the water-proof structure is in barometric pressure communication with the external environment, so as to guarantee the sensitivity of the barometer; and when the water-proof mesh net fails to meet the water-proof requirements (for example, when the terminal device falls into water one meter deep), the water drop detection device controls the control valve to be closed, so as to guarantee the water-proof property of the terminal device.

Further, as shown in FIG. 3, the control valve 16 includes an electromagnet 161, ferromagnetic clapboards 162, and an inner cavity wall 163.

The two ferromagnetic clapboards 162 are symmetrically fixed on the inner cavity wall 163 of the internal cavity, and the electromagnet 161 is arranged on the same side as the two ferromagnetic clapboards 162. In FIG. 3, the electromagnet 161 is located above the ferromagnetic clapboards 162. However, in a practical application, the electromagnet 161 may also be located below the ferromagnetic clapboards 162, which is not specifically limited in the embodiment of the present invention.

The electromagnet 161 is electrically connected to the water drop detection device 14, so that when receiving an electric signal from the water drop detection device 14, the electromagnet 161 is electrified to generate magnetism and drawn onto the ferromagnetic clapboards 162 to achieve sealing, as shown in FIG. 3.1.

In a normal condition, the water drop detection device 14 does not send an electric signal to the electromagnet 161, and in this case, the electromagnet 161 is not electrified and is separated from the ferromagnetic clapboards 162, so that a barometric pressure can be freely transmitted.

When the voltage value corresponding to the water volume detected by the water drop detection device 14 reaches the voltage value corresponding to the preset water volume threshold value, the water drop detection device 14 sends the electric signal to the electromagnet 161, and the electromagnet 161 is electrified to generate magnetism and drawn onto the ferromagnetic clapboards 162. Therefore, the close process of the electromagnet-type control valve is achieved.

Further, contact surfaces between the electromagnet 161 and the ferromagnetic clapboards 162 are covered with a silica gel material. When the electromagnet 161 is drawn onto the ferromagnetic clapboards 162, the sealing performance can be guaranteed owning to the silica gel material and an underwater pressure.

Surfaces of the electromagnet 161 and the two ferromagnetic clapboards 162 are coated with a water-proof material, so as to prevent side effects caused by electrical conduction when the electromagnet 161 is electrified.

It should be noted that, the two symmetric ferromagnetic clapboards 162 in FIG. 3 may be replaced by a ring-shaped ferromagnetic clapboard. The ring-shaped ferromagnetic clapboard is fixed on the inner cavity wall 163 of the internal cavity, the electromagnet 161 is located on one side of the ring-shaped ferromagnetic clapboard, and when the electromagnet 161 is electrified, the electromagnet 161 is drawn onto the ring-shaped ferromagnetic clapboard to achieve sealing.

Besides, an embodiment of the prevent invention further provides a control valve. As shown in FIG. 4, the control valve 16 includes: cavity wall protrusions 164, air guiding holes 165, and a piezoelectric ceramic piece 166.

The two cavity wall protrusions 164 are systematically fixed on the inner cavity wall of the internal cavity; the piezoelectric ceramic piece 166 is arranged between the two cavity wall protrusions 164 and the barometer 12 and divides the internal cavity into two parts; and the two air guiding holes 165 are located between the two cavity wall protrusions 164 and the piezoelectric ceramic piece 166 and are systematically arranged on the inner cavity wall of the internal cavity. Therefore, the barometer 12 is communicated with the external barometric pressure through the two air guiding holes 165, to guarantee a balance between internal and external barometric pressures.

The piezoelectric ceramic piece 166 is electrically connected to the water drop detection device 14, so that when receiving an electric signal from the water drop detection device 14, the piezoelectric ceramic piece 166 deforms elastically and contacts the two cavity wall protrusions 164 to achieve sealing.

When no water is detected by the water drop detection device 14, the piezoelectric ceramic piece 166 is not electrically conductive and does not deform to contact the two cavity wall protrusions 164.

When a voltage value corresponding to a water volume detected by the water drop detection device 14 reaches a voltage value corresponding to a preset water volume threshold value, the water drop detection device 14 sends an electric signal to the piezoelectric ceramic piece 166, and the piezoelectric ceramic piece 166 is electrified and deforms to contact the two cavity wall protrusions 164, as shown in FIG. 4.1. Therefore, the close process of the control valve is achieved.

Further, contact surfaces between the piezoelectric ceramic piece 166 and the two cavity wall protrusions 164 are covered with a silica gel material. When the piezoelectric ceramic piece 166 deforms and contacts the two cavity wall protrusions 164, the sealing performance can be guaranteed owning to the silica gel material and an underwater pressure.

It should be noted that, the two symmetric cavity wall protrusions 164 in FIG. 4 may be replaced by a ring-shaped cavity wall protrusion. The ring-shaped cavity wall protrusion is fixed on the inner cavity wall of the internal cavity; and the piezoelectric ceramic piece 166 is arranged between the ring-shaped cavity wall protrusion and the barometer 12 and divides the internal cavity into two parts. At least one air guiding hole is arranged on the inner cavity wall between the ring-shaped cavity wall protrusion and the piezoelectric ceramic piece 166 and is used for communicating with the external barometric pressure. The piezoelectric ceramic piece 166 is electrically connected to the water drop detection device 14. When the piezoelectric ceramic piece 166 deforms elastically and contacts the ring-shaped cavity wall protrusion, sealing is achieved.

The control valve in the embodiments of the present invention may be formed by an electromagnet or a piezoelectric ceramic piece. In a practical application, the control valve may also be formed by a micro-switch or the like, and details will not be described in the embodiments of the present invention.

Besides, an embodiment of the present invention further provides a terminal device, which may be a mobile phone, a tablet computer, or other electronic devices. The terminal device includes the foregoing water-proof structure.

The embodiments of the present invention provide a water-proof structure provided with an internal barometer for a terminal device and a terminal device, where, the water-proof mesh net arranged between the dust-proof net and the water drop detection device is capable of achieving the air permeability of the terminal device; the water drop detection device is electrically connected to the control valve and is used to detect a voltage value corresponding to a reached water volume; and when the voltage value corresponding to the water volume exceeds the voltage value corresponding to the water volume threshold value, the control valve is closed, thereby achieving the water-proof property of the terminal device. The control valve in the embodiments of the present invention may be formed by an electromagnet and a ferromagnetic clapboard, or may be formed by a piezoelectric ceramic piece. When the water-proof mesh net is capable of meeting water-proof requirements, the water-proof structure is in barometric pressure communication with the external environment, so as to guarantee the sensitivity of the barometer; and when the water-proof mesh net fails to meet the water-proof requirements (for example, when the terminal device falls into water one meter deep), the water drop detection device controls the control valve to be closed, so as to guarantee the water-proof property of the terminal device.

The foregoing descriptions are merely specific embodiments of the present invention, but are not intended to limit the protection scope of the present invention. Any variation or replacement readily figured out by persons skilled in the art within the technical scope disclosed in the present invention shall fall within the protection scope of the present invention. Therefore, the protection scope of the present invention shall be subject to the protection scope of the claims.

What is claimed is:

1. A water-proof structure provided with an internal barometer for a terminal device, wherein the water-proof structure is an internal cavity of the terminal device, the water-proof structure is provided with an opening on a casing of the terminal device so that a barometric pressure inside the water-proof structure is in communication with an external barometric pressure, the water-proof structure comprising:
   the internal barometer arranged inside the water-proof structure;
   a dust-proof net arranged between the opening and the internal barometer;
   a water-proof mesh net arranged between the dust-proof net and the internal barometer;
   a water drop detection device arranged between the water-proof mesh net and the internal barometer; and
   a control valve arranged between the water drop detection device and the internal barometer, wherein the water drop detection device is electrically connected to the control valve and is configured to cause the control valve to close when a water volume detected by the water drop detection device reaches a water volume threshold value.

2. The water-proof structure according to claim 1, wherein the control valve comprises two ferromagnetic clapboards and an electromagnet,
   wherein the two ferromagnetic clapboards are symmetrically fixed on an inner cavity wall of the internal cavity, and the electromagnet is arranged on a same side as the two ferromagnetic clapboards, and
   wherein the electromagnet is electrically connected to the water drop detection device, so that when receiving an electric signal from the water drop detection device, the electromagnet is electrified and drawn onto the two ferromagnetic clapboards to achieve sealing.

3. The water-proof structure according to claim 2, wherein surfaces of the electromagnet and the two ferromagnetic clapboards are coated with a water-proof material,
   wherein contact surfaces between the electromagnet and the two ferromagnetic clapboards are covered with a silica gel material.

4. The water-proof structure according to claim 1, wherein the control valve comprises:
   a ring-shaped ferromagnetic clapboard; and
   an electromagnet,
   wherein the ring-shaped ferromagnetic clapboard is fixed on an inner cavity wall of the internal cavity, and the electromagnet is arranged on a same side as the ring-shaped ferromagnetic clapboard, and
   wherein the electromagnet is electrically connected to the water drop detection device, so that when receiving an electric signal from the water drop detection device, the electromagnet is electrified and drawn onto the ring-shaped ferromagnetic clapboard to achieve sealing.

5. The water-proof structure according to claim 1, wherein the control valve comprises:
   two cavity wall protrusions;
   two air guiding holes; and
   a piezoelectric ceramic piece,
   wherein the two cavity wall protrusions are fixed on an inner cavity wall of the internal cavity,
   wherein the piezoelectric ceramic piece is arranged between the two cavity wall protrusions and the internal barometer and divides the internal cavity into two parts,
   wherein the two air guiding holes are located between the two cavity wall protrusions and the piezoelectric ceramic piece and are systematically arranged on the inner cavity wall of the internal cavity,
   wherein the internal barometer is in communication with the external barometric pressure through the two air guiding holes, and
   wherein the piezoelectric ceramic piece is electrically connected to the water drop detection device so that when an electric signal from the water drop detection device is received, the piezoelectric ceramic piece deforms elastically and contacts the two cavity wall protrusions to achieve sealing.

6. The water-proof structure according to claim 5, wherein contact surfaces between the piezoelectric ceramic piece and the two cavity wall protrusions are covered with a silica gel material.

7. The water-proof structure according to claim 1, wherein the control valve comprises:
   a ring-shaped cavity wall protrusion;
   at least one air guiding hole; and
   a piezoelectric ceramic piece, wherein the ring-shaped cavity wall protrusion is fixed on an inner cavity wall of the internal cavity, wherein the piezoelectric ceramic piece is arranged between the ring-shaped cavity wall protrusion and the internal barometer and divides the internal cavity into two parts, wherein the at least one air guiding hole is located between the ring-shaped cavity wall protrusion and the piezoelectric ceramic piece and is arranged on the inner cavity wall of the internal cavity, wherein the internal barometer is in communication with the external barometric pressure through the at least one air guiding hole, and wherein the piezoelectric ceramic piece is electrically connected to the water drop detection device so that when an electric signal from the water drop detection device is received, the piezoelectric ceramic piece deforms elastically and contacts the ring-shaped cavity wall protrusion to achieve sealing.

8. A method for controlling the water-proof structure according to claim 1, the method comprising:

detecting, by the water drop detection device, that a voltage value corresponding to a reached water volume exceeds a voltage threshold value corresponding to the water volume threshold value;

sending, by the water drop detection device, an electric signal to the control valve to notify the control valve of executing a close action; and executing, by the control valve, the close action after receiving the electric signal.

9. A water-proof structure comprising:

an internal barometer arranged inside the water-proof structure;

a dust-proof net arranged between an opening and the internal barometer;

a water-proof mesh net arranged between the dust-proof net and the internal barometer;

a water drop detection device arranged between the water-proof mesh net and the internal barometer; and a control valve arranged between the water drop detection device and the internal barometer, wherein the water drop detection device is electrically connected to the control valve and wherein the water drop detection device is configured to cause the control valve to close when a water volume detected by the water drop detection device reaches a water volume threshold value.

10. A terminal device comprising:

a casing;

an opening in the casing; and the water-proof structure according to claim 9, wherein the water-proof structure is connected to the opening in the casing.

11. The terminal device according to claim 10, wherein the terminal device is a mobile phone terminal.

12. The water-proof structure according to claim 9, wherein the control valve comprises two ferromagnetic clapboards and an electromagnet, wherein the two ferromagnetic clapboards are symmetrically fixed on a wall, and the electromagnet is arranged on a same side as the two ferromagnetic clapboards, and wherein the electromagnet is electrically connected to the water drop detection device, so that when receiving an electric signal from the water drop detection device, the electromagnet is electrified and drawn onto the two ferromagnetic clapboards to achieve sealing.

13. The water-proof structure according to claim 12, wherein surfaces of the electromagnet and the two ferromagnetic clapboards are coated with a water-proof material, wherein contact surfaces between the electromagnet and the two ferromagnetic clapboards are covered with a silica gel material.

14. The water-proof structure according to claim 9, wherein the control valve comprises:

a ring-shaped ferromagnetic clapboard; and an electromagnet, wherein the ring-shaped ferromagnetic clapboard is fixed on a wall, and the electromagnet is arranged on a same side as the ring-shaped ferromagnetic clapboard, and wherein the electromagnet is electrically connected to the water drop detection device, so that when receiving an electric signal from the water drop detection device, the electromagnet is electrified and drawn onto the ring-shaped ferromagnetic clapboard to achieve sealing.

15. The water-proof structure according to claim 9, wherein the control valve comprises:

two wall protrusions;

two air guiding holes; and a piezoelectric ceramic piece, wherein the two wall protrusions are fixed on a wall, wherein the piezoelectric ceramic piece is arranged between the two wall protrusions, wherein the two air guiding holes are located between the two wall protrusions and the piezoelectric ceramic piece and are systematically arranged on the wall, wherein the internal barometer is in communication with an external barometric pressure through the two air guiding holes, and wherein the piezoelectric ceramic piece is electrically connected to the water drop detection device so that when an electric signal from the water drop detection device is received, the piezoelectric ceramic piece deforms elastically and contacts the two wall protrusions to achieve sealing.

16. The water-proof structure according to claim 15, wherein contact surfaces between the piezoelectric ceramic piece and the two wall protrusions are covered with a silica gel material.

17. The water-proof structure according to claim 9, wherein the control valve comprises:

a ring-shaped wall protrusion;

at least one air guiding hole; and a piezoelectric ceramic piece, wherein the ring-shaped wall protrusion is fixed on a wall, wherein the piezoelectric ceramic piece is arranged between the ring-shaped wall protrusion, wherein the at least one air guiding hole is located between the ring-shaped wall protrusion and the piezoelectric ceramic piece and is arranged on the wall, wherein the internal barometer is in communication with an external barometric pressure through the at least one air guiding hole, and wherein the piezoelectric ceramic piece is electrically connected to the water drop detection device so that when an electric signal from the water drop detection device is received, the piezoelectric ceramic piece deforms elastically and contacts the ring-shaped wall protrusion to achieve sealing.

* * * * *